United States Patent
Nishide et al.

(10) Patent No.: US 7,265,687 B2
(45) Date of Patent: Sep. 4, 2007

(54) QUANTIZATION-PRECISION-REPRODUCTION METHOD, QUANTIZATION-PRECISION-REPRODUCTION DEVICE, IMAGE-PICKUP DEVICE, INFORMATION-PROCESSING DEVICE, AND PROGRAM

(75) Inventors: Yoshiaki Nishide, Kanagawa (JP); Hiromasa Ikeyama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/344,138

(22) Filed: Feb. 1, 2006

(65) Prior Publication Data
US 2006/0176199 A1      Aug. 10, 2006

(30) Foreign Application Priority Data
Feb. 8, 2005      (JP)      ............... 2005-031205

(51) Int. Cl.
*H03M 3/00*      (2006.01)
(52) U.S. Cl. ......................... 341/50; 341/143
(58) Field of Classification Search ............. 341/50–95
See application file for complete search history.

(56) References Cited

U.S. PATENT DOCUMENTS 5,825,310 A * 10/1998 Tsutsui ........................ 341/51
5,825,979 A * 10/1998 Tsutsui et al. ............... 704/500
6,011,824 A * 1/2000 Oikawa et al. .............. 375/377
6,167,157 A   12/2000 Sugahara
6,310,564 B1 * 10/2001 Fujimoto ..................... 341/51
7,126,501 B2 * 10/2006 Moriya et al. ............... 341/50
2004/0130471 A1   7/2004 Lee

FOREIGN PATENT DOCUMENTS

GB      2 298 069 A      8/1996
JP      2003-259368      9/2003

OTHER PUBLICATIONS

Patent Abstracts of Japan, JP 08-149470, Jun. 7, 1996.

* cited by examiner

*Primary Examiner*—Lam T. Mai
(74) *Attorney, Agent, or Firm*—Oblon, Spivak, McClelland, Maier & Neustadt, P.C.

(57) ABSTRACT

A quantization-precision-reproduction method including the steps of reproducing an m-bit-length high-precision component lower than or equal to quantization precision of an n-bit-length digital signal on the basis of the n-bit-length digital signal, and generating an n+m-bit-length digital signal by adding the reproduced m-bit-length high-precision component to a low-order bit of the n-bit-length digital signal is provided.

13 Claims, 13 Drawing Sheets

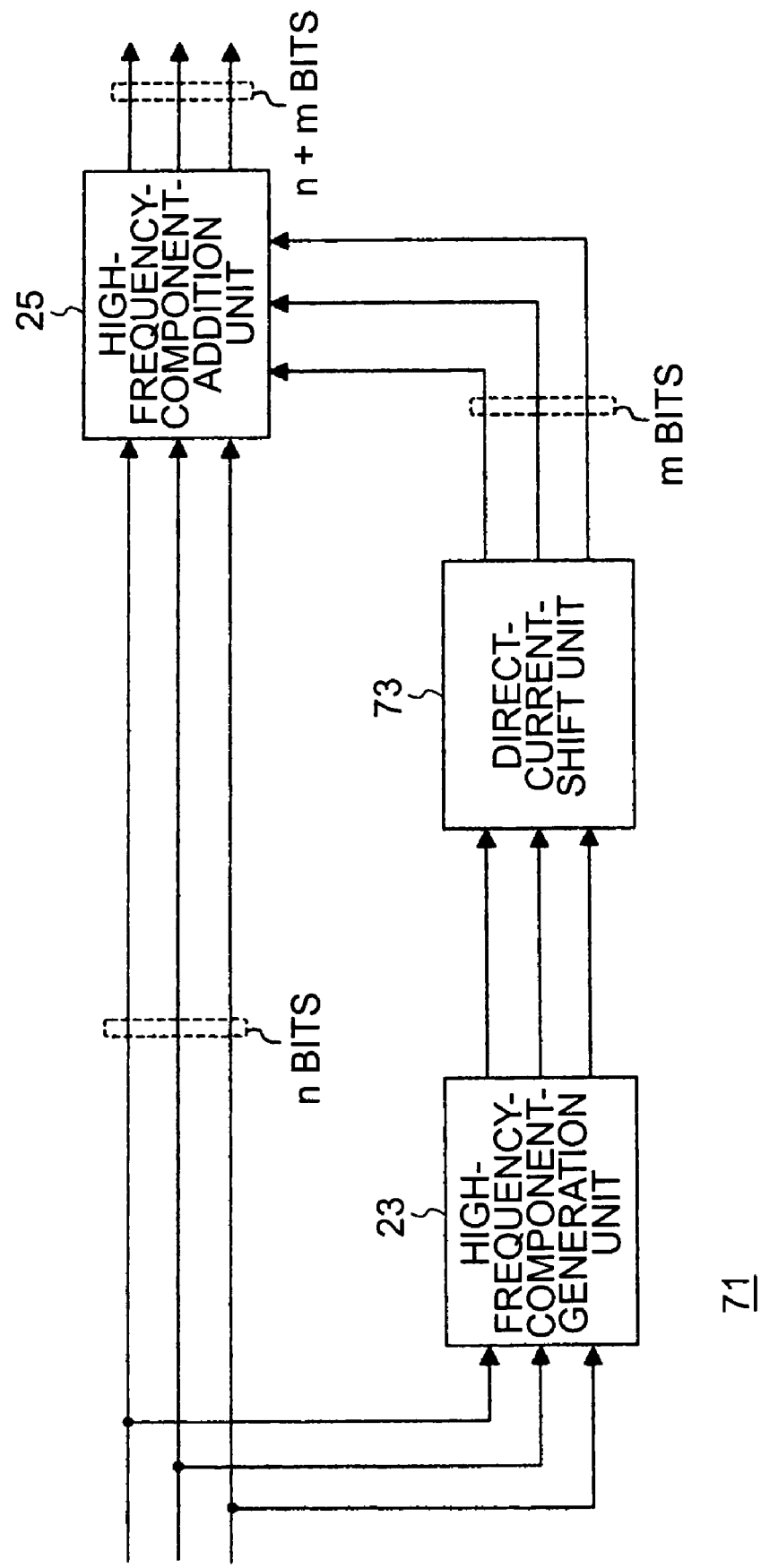

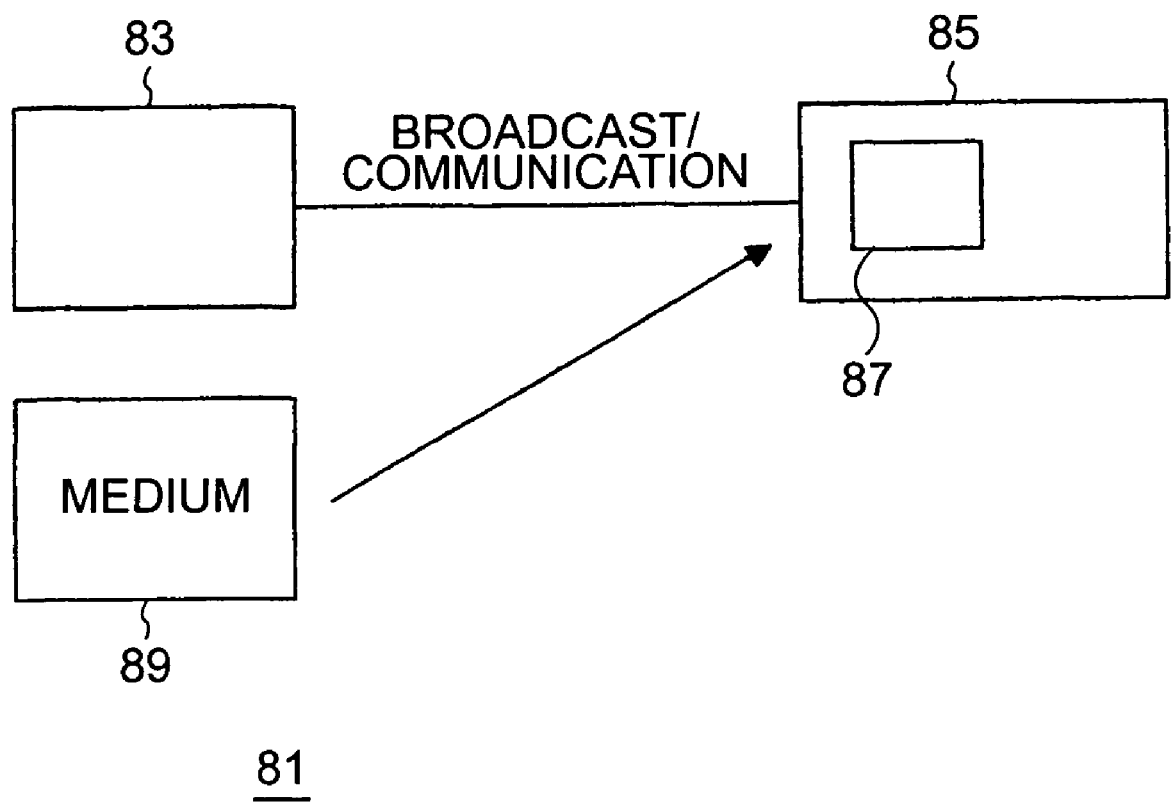

QUANTIZATION-PRECISION-REPRODUCTION METHOD, QUANTIZATION-PRECISION-REPRODUCTION DEVICE, IMAGE-PICKUP DEVICE, INFORMATION-PROCESSING DEVICE, AND PROGRAM

CROSS REFERENCES TO RELATED APPLICATIONS

The present invention contains subject matter related to Japanese Patent Application JP 2005-031205 filed in the Japanese Patent Office on Feb. 8, 2005, the entire contents of which are incorporated herein by reference.

BACKGROUND OF THE INVENTION

1. Field of the Invention

The present invention proposed in this specification relates to a method for reproducing the quantization precision of a digital signal. The present invention is achieved, so as to be used, as one of the functions of a quantization-precision-reproduction device, an image-pickup device, and an information-processing device. Further, the present invention is achieved, as a program adapted to control the above-described devices.

Here, the digital signal for processing includes a signal in an ultimate form acting on the sensory organs of a person, such as a video signal, an audio signal, and so forth, a signal transmitted from a measuring device, a communication signal, and data read from a recording medium.

2. Description of the Related Art

When an analog signal is converted into a digital signal, the information amount of the digital signal is determined by a sampling frequency and the quantization-bit number. The sampling frequency determines the maximum frequency that can be represented by Nyquist's theorem and the quantization-bit number determines precision in an amplitude direction. Namely, the quantization-bit number determines the minimum change amount of the digital signal.

If the determined minimum change amount is too large with reference to a signal for representation, a quantization distortion is perceived by a person. Therefore, it is favorable to increase the number of quantization bits for an output signal, so as to reproduce an image with smooth gray scale.

In general, however, the performance of an analog-to-digital conversion (A/D conversion) device is limited. Therefore, it is difficult to increase the quantization-bit number appropriately. Further, it is often difficult to use an A/D converter configured to achieve a large number of quantization bits from the viewpoint of the manufacturing cost.

Subsequently, there have been proposed methods for reducing the quantization distortion, which is useful in the case where the quantization-bit number is insufficient with reference to the dynamic range of an input signal.

For example, there has been proposed a method for increasing the bit number in the least-significant-bit direction and inserting a random noise into the part corresponding to the increased bit number.

Further, there has been proposed a method for switching between an output signal transmitted from a low-pass filter and an original signal according to the characteristic of the original signal.

For example, Japanese Unexamined Patent Application Publication No. 2003-259368 discloses technologies relating to the above-described methods.

SUMMARY OF THE INVENTION

The former method described above uses the sensory characteristics of a person. Namely, the method is adapted to make the person perceive a fine value change in a part where no value change occurs. According to the above-described method, however, the random noise may be raised to a high-order bit and perceived by the person, when the gain of the original signal is increased.

The latter method described above allows decreasing noise components while switching between the output signal of the low-pass filter and the original signal. However, if the above-described switch is not performed successfully, there may be a significant high-frequency-component drop.

Accordingly, inventors who filed this patent application propose a configuration adapted to reproduce a high-precision component lower than or equal to the quantization precision of an original signal while maintaining the information of the original signal.

Namely, the inventors propose a quantization-precision-reproduction method including the steps of:

(a) reproducing an m-bit-length high-precision component lower than or equal to quantization precision of an n-bit-length digital signal on the basis of the n-bit-length digital signal, and (b) generating an n+m-bit-length digital signal by adding the reproduced m-bit-length high-precision component to a low-order bit of the n-bit-length digital signal.

According to the above-described method, it becomes possible to reproduce a high-precision component lower than or equal to that of an original signal. Further, since information about the original signal can be maintained in a digital signal or the reproduced high-precision component, as it is, it becomes possible to prevent the original signal from being deteriorated when the high-precision component is reproduced.

BRIEF DESCRIPTION OF THE DRAWINGS

FIG. 11 shows a quantization-precision-reproduction circuit according to another embodiment of the present invention;

FIG. 12 shows the configuration of an example communication system;

DESCRIPTION OF THE PREFERRED EMBODIMENTS

Hereinafter, technologies according to embodiments of the present invention will be described.

It is to be noted that at least one of commonly and/or publicly known technologies in the field of the technologies according to the embodiments of the present invention is used for part that is not shown and/or disclosed in this specification.

Further, the present invention is not limited to any one of the following embodiments.

(A) Embodiments

In the following description, technologies related to the present invention are used for an information-processing device configured to process image data. Here, an image-pickup system is described, as the above-described information-processing device, for example.

(A-1) System Configuration

Figure 1:
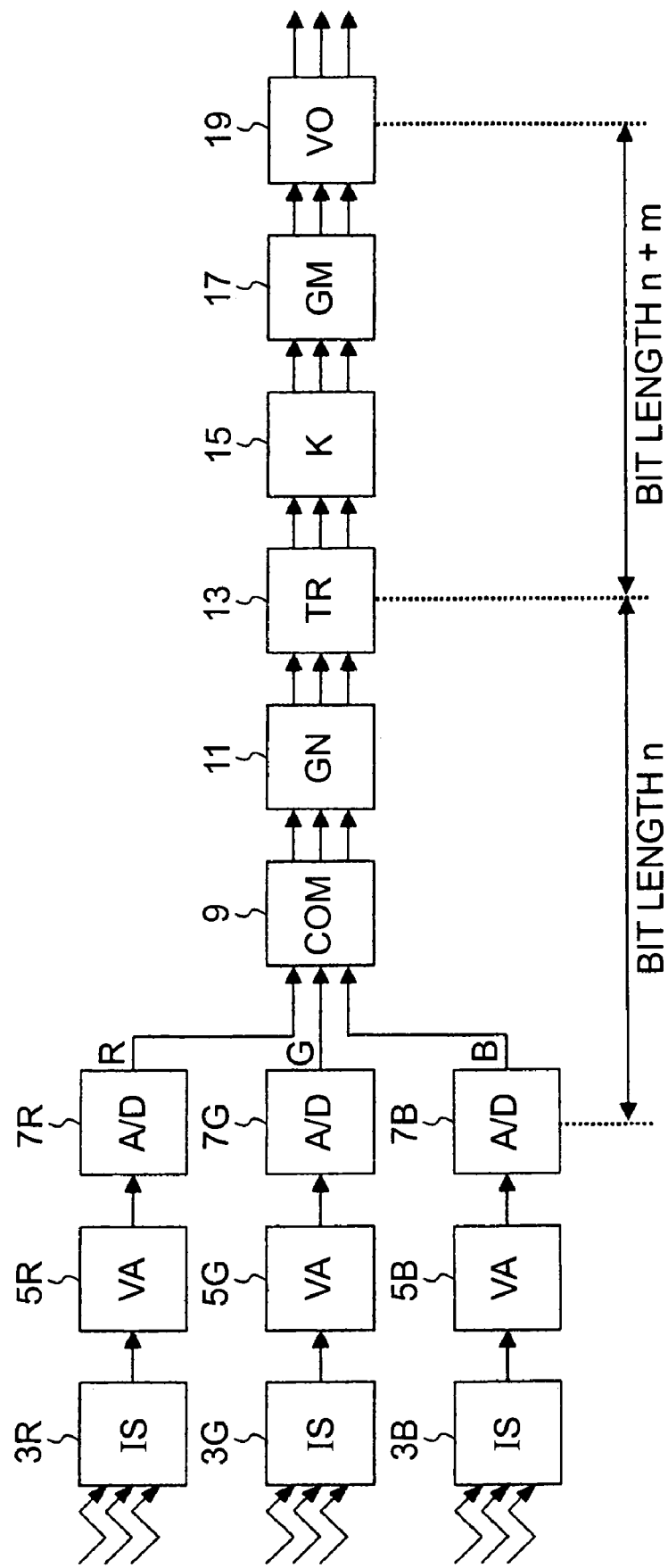
FIG. 1 shows the configuration of an example image-pickup system.

FIG. 1 shows an example configuration of the above-described image-pickup system, wherein a signal red (R), a signal green (G), and a signal blue (B) are processed in parallel. However, the example configuration shown in FIG. 1 can be used for an image-pickup system configured to process a brightness signal and a color-difference signal in parallel and/or an image-pickup system configured to process a composite signal.

Hereinafter, each of elements of the image-pickup system will be described.

Each of image sensors 3R, 3G, and 3B is provided, as a photoelectric-conversion element configured to convert an optical signal into an electric signal. The image sensor 3R transmits a signal red (R), the image sensor 3G transmits a signal green (G), and the image sensor 3B transmits a signal blue (B). Hereinafter, a signal transmitted from each of the image sensors 3R, 3G, and 3B is referred to as a color signal.

The above-described color signal may be either a video signal or a still-image signal.

Each of video amplifiers (VA) 5R, 5G, and 5B is provided, as an amplifier element configured to adjust the level of the color signal to a desired signal level. More specifically, each of the video amplifiers 5R, 5G, and 5B adjusts the color-signal level so that the dynamic range of an amplified electric signal agrees with the allowable input range of each of analog-to-digital (A/D) converters 7R, 7G, and 7B.

Each of the A/D converters 7R, 7G, and 7B is a processing device configured to convert the color signal which is generated, as an analog signal into a digital signal. Here, the color signal converted into the digital signal is represented as n bits, where the letter n indicates a natural number. For example, an expression n=8 holds.

A correction circuit (COM) 9 is provided, as a processing device configured to perform correction including edge correction, white-balance correction, sensitivity correction, and so forth.

A gain-adjustment circuit (GN) 11 is configured to adjust the gain of each of the color signals, so as to perform appropriate post processing. At that time, each of the color signals has become an n-bit-length digital signal.

A quantization-precision-reproduction circuit (TR) 13 is a processing device configured to reproduce the quantization precision of each of the color signals.

As a rule, the quantization-precision-reproduction circuit (TR) 13 reproduces a high-precision component lower than or equal to the quantization precision of an original signal while maintaining information about the original signal. More specifically, the quantization-precision-reproduction circuit (TR) 13 reproduces m-bit-length data, as the high-precision component.

In that case, the high-precision component provided, as the m-bit-length data is reproduced from an n-bit-length color signal, that is, the original signal. The letter m indicates a natural number. For example, an expression m=2 holds.

The quantization-precision-reproduction circuit (TR) 13 adds the reproduced m-bit-length data, that is, the high-precision component to a low-order bit of the n-bit-length color signal so that the n-bit-length color signal is converted into a digital signal of an n+m-bit-length. As a result, it becomes possible to reduce the minimum change amount that can be represented.

A knee-correction circuit (K) 15 is a processing device configured to compress the level of the color signal so that the dynamic range of the color signal falls within a predetermined range.

A gamma-correction circuit (GM) 17 is a processing device configured to correct the gray-scale characteristic of the color signal so that there is an inverse relationship between the gray-scale characteristic and the gamma characteristic of an output device. If a monitor is used, as the output device, the gamma coefficient thereof is usually 2.2. A printer may also be used, as the output device.

An output-signal-generation circuit (VO) 19 is a processing device configured to convert the color signal transmitted thereto into a signal in an ultimate output form and transmit the converted signal.

As has been described, the image-pickup device includes commonly known components except for the quantization-precision-reproduction circuit (TR) 13. By using the quantization-precision-reproduction circuit (TR) 13, when the data corresponding to the least significant bit is raised to a high-order bit by the gain-adjustment circuit (GN) 11 and the gamma-correction circuit (GM) 17, it becomes possible to make up for the gray-scale shortage of an output image.

The above-described image-pickup system can be used for a video-camera system and/or a digital-camera system.

(B) Configuration of Quantization-Precision-Reproduction Circuit

Next, the configurations of quantization-precision-reproduction circuits according to embodiments of the present invention will be described. Each of the quantization-precision-reproduction circuits is configured to reproduce a digital signal with quantization precision higher than that of the digital signal obtained by each of the A/D converters 7R, 7G, and 7B.

(B-1) First Embodiment

Figure 2:
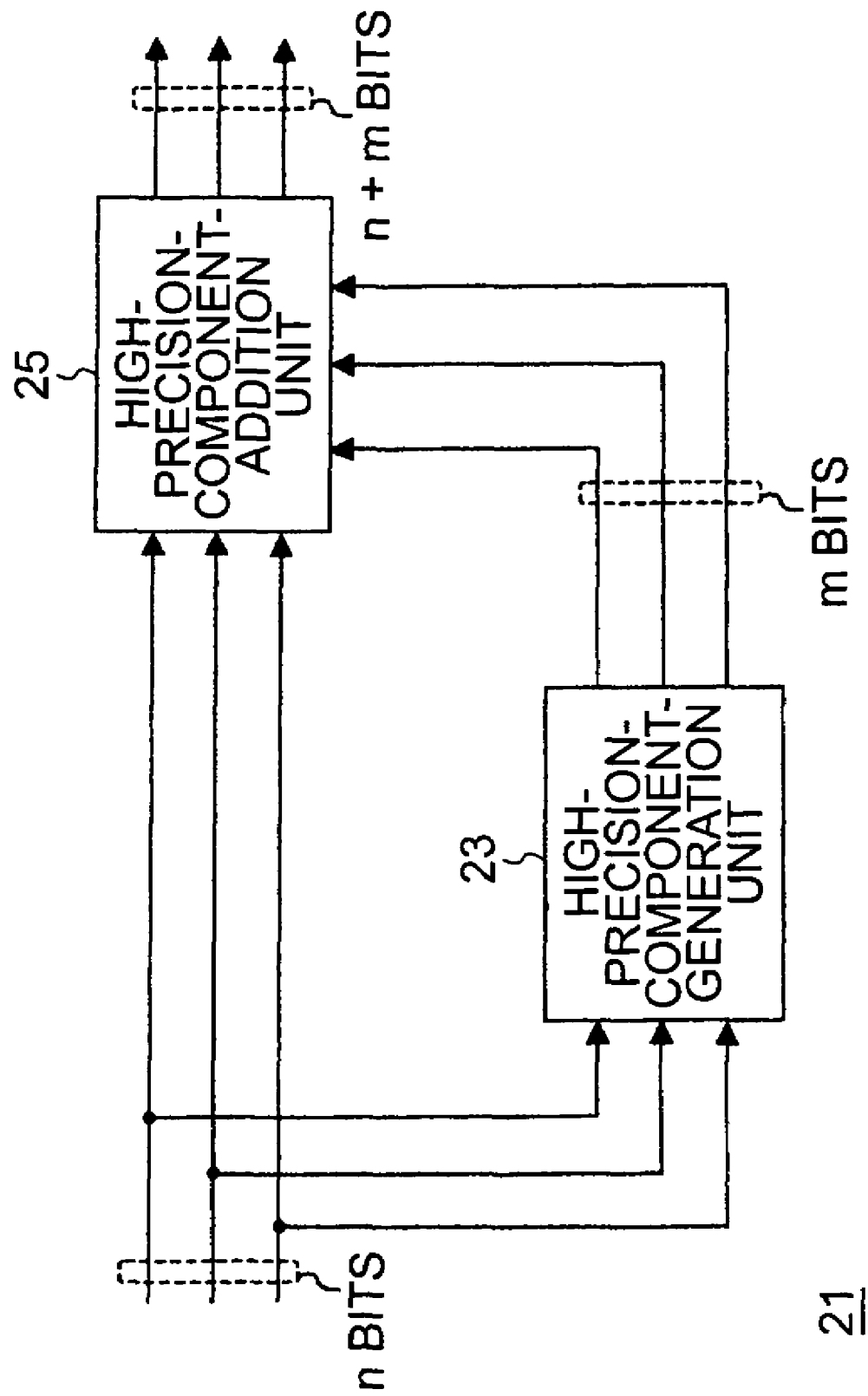
FIG. 2 shows a quantization-precision-reproduction circuit according to an embodiment of the present invention.

FIG. 2 shows a quantization-precision-reproduction circuit 21 according to a first embodiment of the present invention. The quantization-precision-reproduction circuit 21 includes a high-precision-component-generation unit 23 and a high-precision-component-load unit 25.

The high-precision-component-generation unit 23 is a processing device configured to generate a signal component (a high-precision component) on the basis of a digital signal (an original signal) of n bits so that the signal component is lower than or equal to the quantization precision of the n-bit digital signal. Here, a low-order-m-bit signal component is generated, as shown by parts (A) and (B) shown in FIG. 3.

For example, where an expression m=1 holds, the information corresponding to one-half of the minimum-change width of the original signal is generated. Further, where an expression m=2 holds, the information corresponding to one-fourth of the minimum-change width of the original signal is generated.

Unlike the random noise, the above-described m-bit information is highly correlated with the original signal.

The high-precision component can be generated by performing known interpolation processing. For example, the high-precision component can be generated by performing filtering, over sampling, and so forth.

Figure 3:
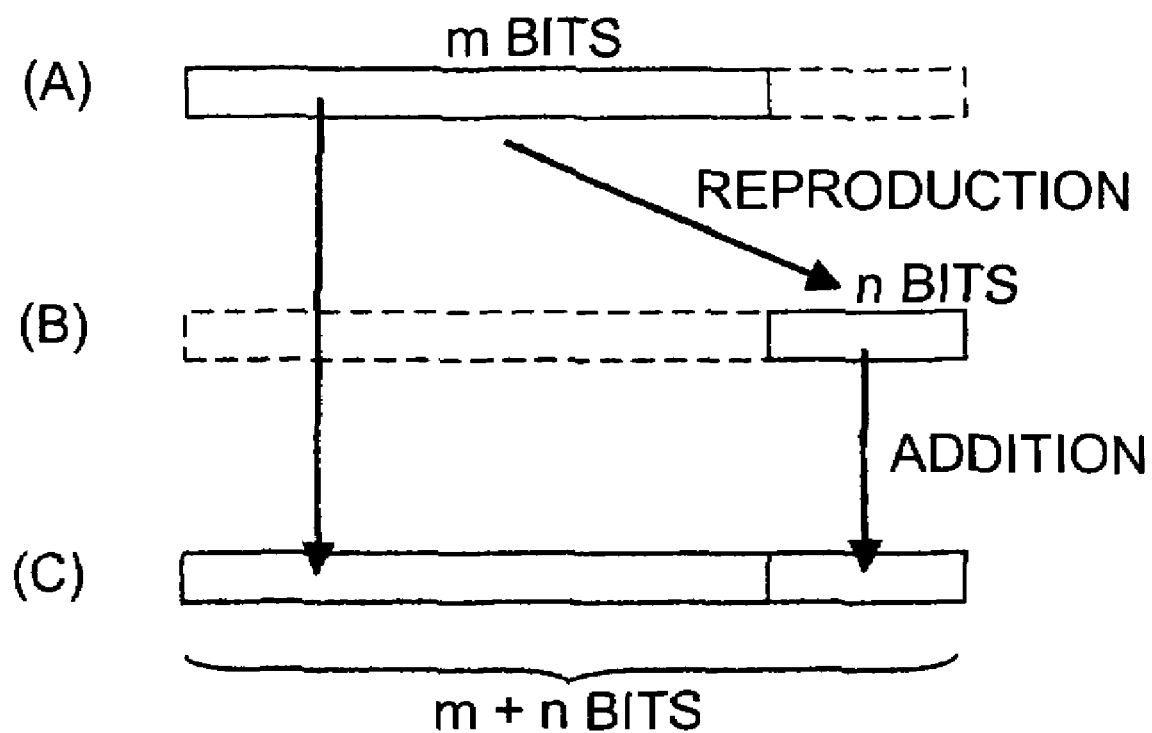
FIG. 3 shows example procedures performed for generating a quantization-precision-reproduction signal.

The high-precision-component-addition unit 25 is a processing device configured to add the generated m-bit-high-precision component to a low-order bit of the n-bit digital signal so that a digital signal with increased quantization precision (a quantization-precision-reproduction signal) is generated (see part (C) of FIG. 3).

As is the case with part (C) of FIG. 3, the information about the original signal is used, as it is, as high-order-n-bit information. That is to say, basic waveform information is maintained, as it is, which shows that a basic waveform does not change irrespective of whether or not the high-precision component is added.

Subsequently, when the high-precision component is reproduced, the original signal does not deteriorate. On the contrary, it becomes possible to reduce noise components, which can be hardly achieved by using known technologies.

Further, since a signal with predetermined quantization precision higher than that of the A/D converter can be generated, the following effects can be expected.

Figure 4A:
FIG. 4A shows an effect produced by increasing a dynamic range.
Figure 4B:
FIG. 4B also shows the effect produced by increasing the dynamic range.
Figure 4C:
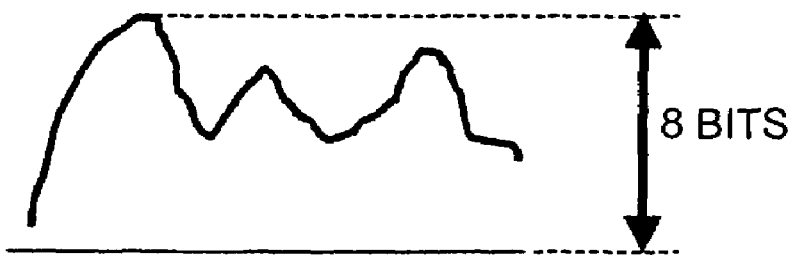
FIG. 4C also shows the effect produced by increasing the dynamic range.

For example, it becomes possible to increase the dynamic range of an analog signal transmitted to the A/D converter (see FIGS. 4A and 4C). This is because the quantization-precision-reproduction circuit 21 can reproduce information with quantization precision lower than or equal to that of the original signal, even though the minimum-change level of a signal transmitted from the A/D converter increases.

In the case of the known systems, it is difficult to reproduce precision higher than that of a signal transmitted from the A/D converter by performing post processing. Therefore, it is preferable that the dynamic range of an analog signal is adjusted so that the dynamic range matches with that of the A/D converter, as shown in FIG. 4B.

Naturally, the dynamic range of the analog signal transmitted to the A/D converter is limited and part of information about the analog signal is lost.

(B-2) Second Embodiment

Figure 5:
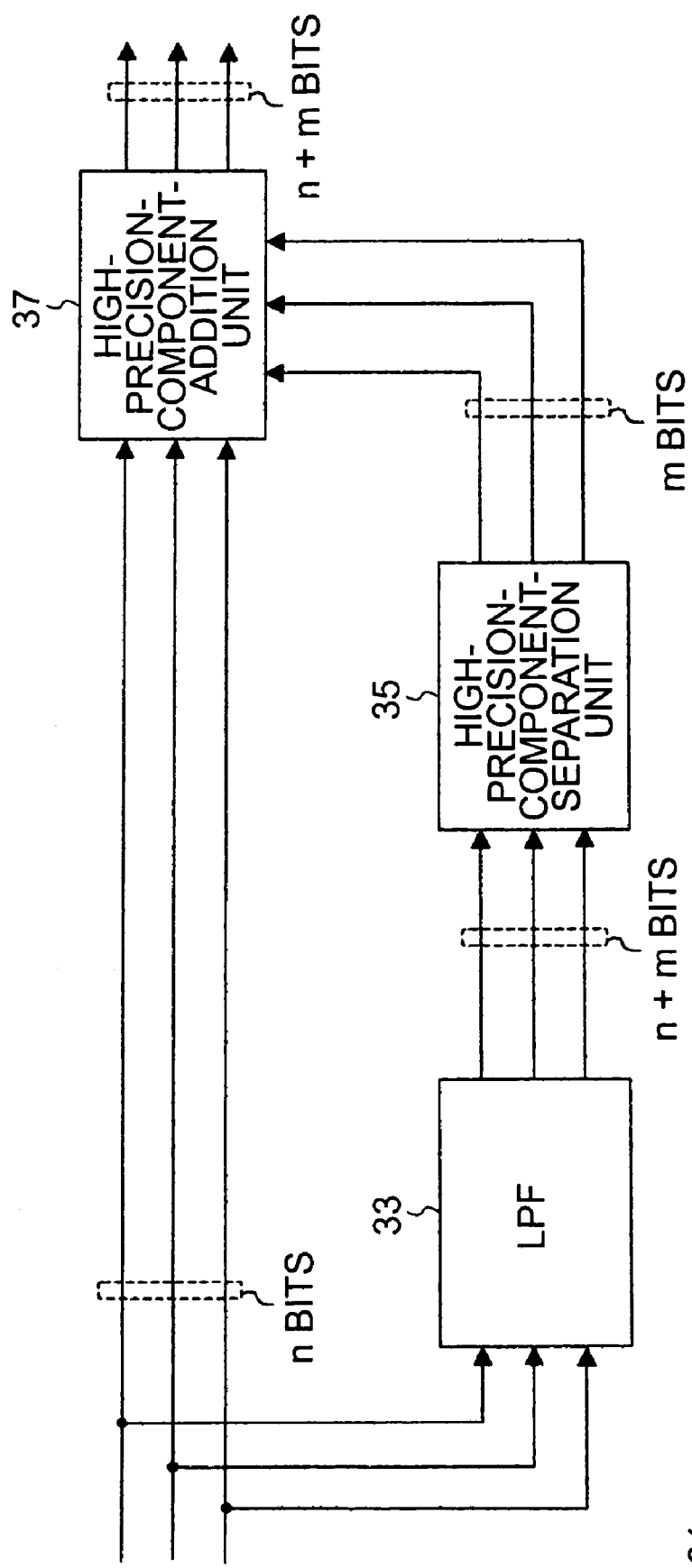
FIG. 5 shows a quantization-precision-reproduction circuit according to another embodiment of the present invention.

FIG. 5 shows a quantization-precision-reproduction circuit 31 according to a second embodiment of the present invention. The quantization-precision-reproduction circuit 31 includes a low-pass filter 33, a high-precision-component-separation unit 35, and a high-precision-component-addition unit 37. The low-pass filter 33 and the high-precision-component-separation unit 35 correspond to the above-described high-precision-component-generation unit 23.

The low-pass filter 33 generates a digital signal of an n+m bit length, where the digital signal includes a signal component (a high-precision component) lower than or equal to the quantization precision of the original signal. The calculation-word length of the low-pass filter 33 corresponds to n+m bits or more.

Figure 6:
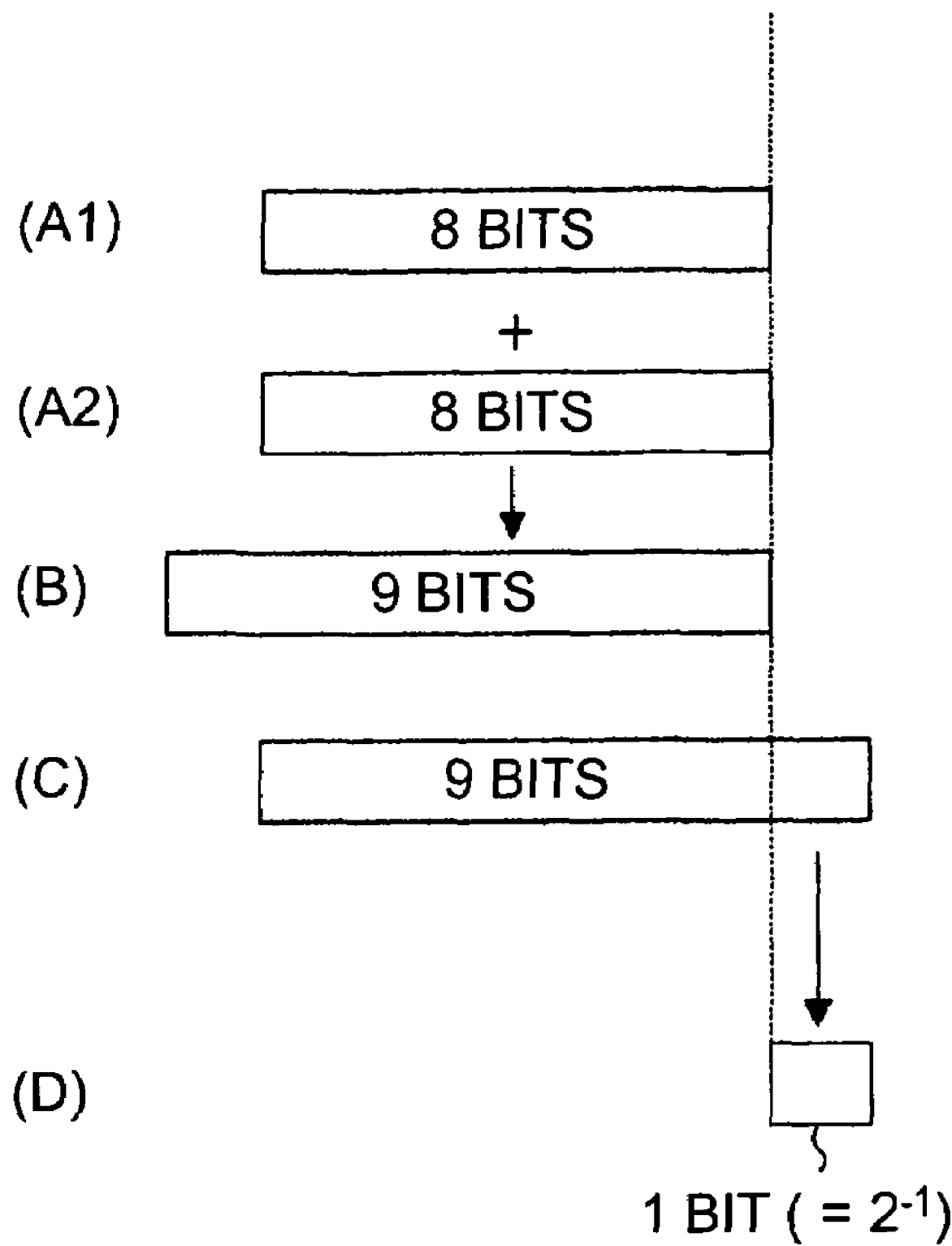
FIG. 6 shows the theory of high-precision-component generation using a low-pass filter.

FIG. 6 shows an example signal transmitted from the low-pass filter 33, where the expression m=1 holds. In the case of FIG. 6, a digital signal which is used, as the original signal, is of an 8-bit length. For example, by calculating the average value of two digital signals, an output signal of 9 bits including bit information with quantization precision lower than or equal to the quantization precision of the original signal can be generated (see part (C) of FIG. 6).

Further, part (A1) and part (A2) of FIG. 6 show two digital signals for processing. Further, part (B) of FIG. 6 shows a result obtained by adding the two digital signals to each other. Further, part (C) of FIG. 6 shows a result of adjusting the gain of the digital signal shown in part (B) of FIG. 6. In that case, the least significant bit shown in part (D) of FIG. 6 corresponds to a high-precision component.

Figure 7:
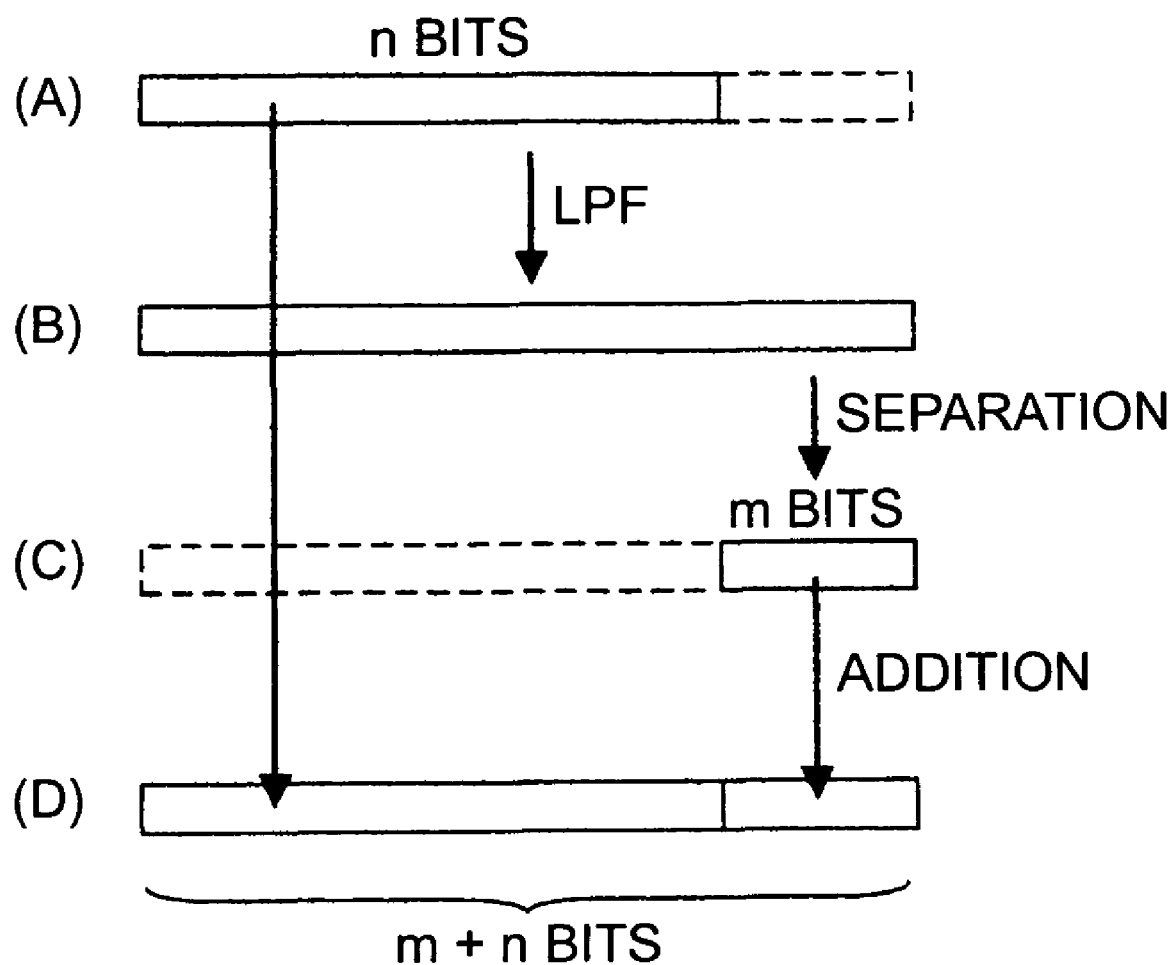
FIG. 7 shows example procedures performed for generating another quantization-precision-reproduction signal.

By performing the above-described processing procedures, the low-pass filter 33 generates a low-pass-output signal of an n+m-bit length, as shown by part (B) of FIG. 7. Part (A) of FIG. 7 shows a digital signal of an n-bit length, that is, the original signal.

The high-precision-component-separation unit 35 is a processing device configured to separate the digital signal corresponding to low-order m bits from a low-pass-output signal of an n+m-bit length, as a high-precision component, as shown by part (C) of FIG. 7.

The high-precision-component-addition unit 37 adds the generated m-bit high-precision component to a low-order bit of the n-bit digital signal so that a digital signal with increased quantization precision is generated, as shown by part (D) of FIG. 7.

The use of the above-described quantization-precision-reproduction circuit 31 allows achieving the same effects as those of the first embodiment.

(B-3) Third Embodiment

Thus, by using the quantization-precision-reproduction circuit 31 according to the second embodiment, it becomes possible to obtain a smooth image with the gray-scale information corresponding to quantization precision higher than that of the A/D converter.

On the other hand, according to a method for reproducing quantization precision by using a filter, the frequency characteristic of a high-precision component may become lower than that of the original signal. For example, according to the second embodiment, all of high-frequency components drop slightly.

As a bit length for addition increases, the above-described drop becomes significant. Further, as the number of reproduced bits for addition increases, the ringing of a high-pass filter often occurs, for example, at a part where the values of the high-frequency components significantly change (e.g., an edge).

On the other hand, a person has such a perception characteristic that the person easily perceives insufficient quantization precision at a flat part where the number of high-frequency components is low. On the contrary, according to the perception characteristic, a person hardly perceives insufficient quantization precision (deteriorated image quality) at a part where the number of high-frequency components is high.

In a third embodiment of the present invention, a quantization-precision-reproduction circuit configured to achieve improved image quality by using the perception characteristic of a person will be described.

Figure 8:
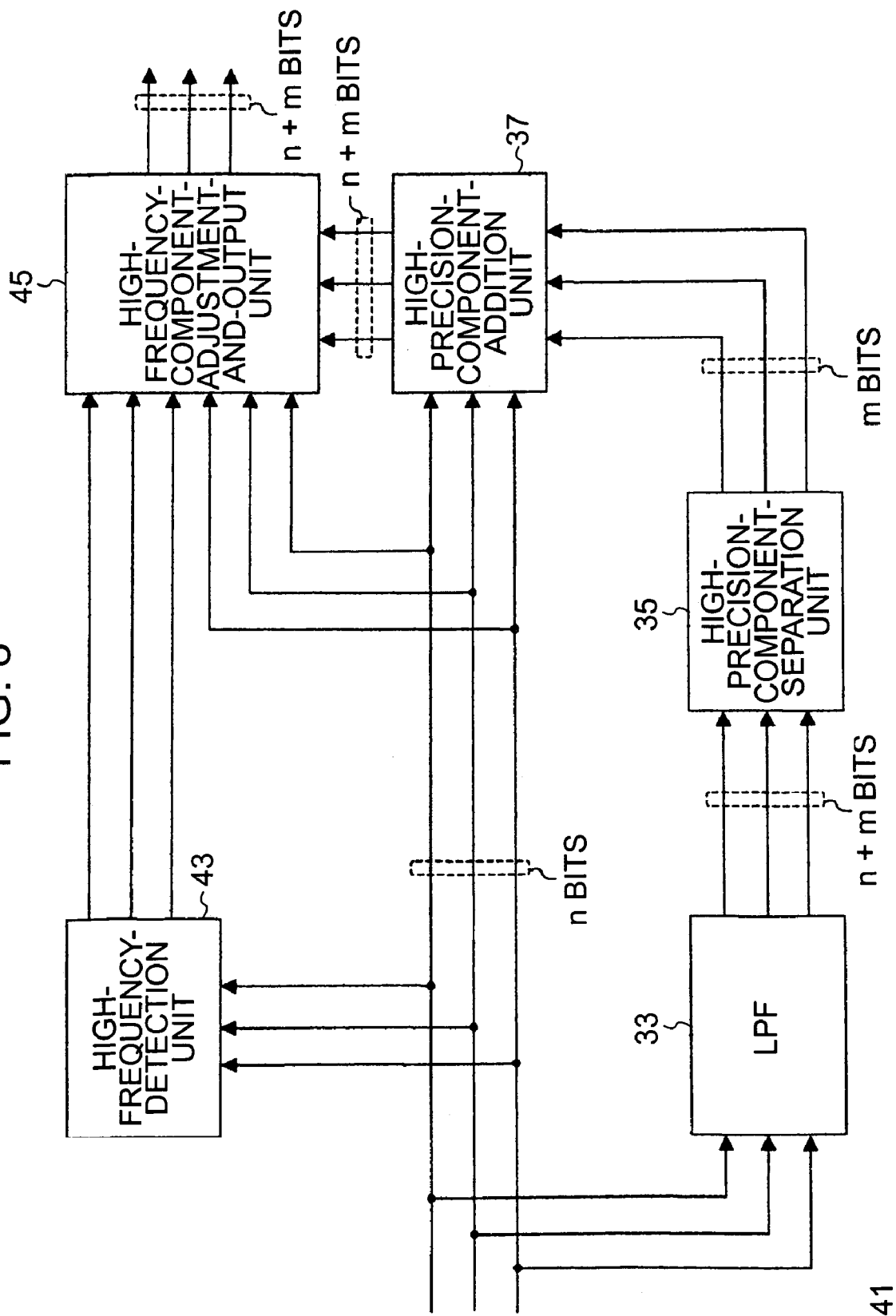
FIG. 8 shows a quantization-precision-reproduction circuit according to another embodiment of the present invention.

FIG. 8 shows a quantization-precision-reproduction circuit 41 according to the third embodiment. In FIG. 8, the same parts as those shown in FIG. 5 are designated by the same reference numerals, so as to omit the description thereof.

The quantization-precision-reproduction circuit 41 includes the low-pass filter 33, the high-precision-component-separation unit 35, the high-precision-component-addition unit 37, a high-frequency-detection unit 43, and a high-frequency-component-adjustment-and-output unit 45. That is to say, the quantization-precision-reproduction circuit 41 is different from the above-described quantization-precision-reproduction circuits in that it includes the high-frequency-detection unit 43 and the high-frequency-component-adjustment-and-output unit 45.

The high-frequency-detection unit 43 is a processing device configured to detect at least one high-frequency component included in the n-bit-length digital signal, that is, the original signal. As the number of the high-frequency component increases, a detected output value becomes high.

The above-described determination processing may be performed for each of separated areas. Otherwise, above-described determination processing may be performed on a screen-by-screen basis.

In the third embodiment, the determination processing is performed for each color signal. However, the determination processing may be collectively performed for the three types of color signals. Further, the determination processing may be performed on the basis of a brightness signal generated from the color signal.

As a result, the high-frequency-detection unit 43 transmits information about whether or not an original signal for processing includes a large number of high-frequency components (namely, information about whether or not the number of high-frequency components is high), as a detection signal.

The high-frequency-component-adjustment-and-output unit 45 is a processing device configured to adjust the effect of quantization-precision reproduction according to the result of high-frequency-component detection.

The high-frequency-component-adjustment-and-output unit 45 generates an output signal by increasing and/or decreasing the combination ratio of the original signal (an n-bit digital signal) and the quantization-precision-reproduction signal (=original signal+high-precision component) in a complementary manner.

For example, the output signal is generated by performing a calculation shown as "original signal·x/100 +quantization-precision-reproduction signal·(1−x/100)". Here, a variable x is determined to be from 0 to 100%.

For example, a detected high-frequency-component signal is used, as the variable x. In that case, in a part where the number of the high-frequency components is high (where an expression x=100 holds), the output signal becomes equivalent to the original signal. Namely, an n-bit digital signal, or an n+m-bit digital signal is transmitted, as an output signal. Here, an m-bit-length low-order bit of the n+m-bit digital signal is determined to be "0".

On the other hand, in a part where the high-frequency-component number is low (where an expression x=0 holds), the output signal becomes equivalent to the quantization-precision-reproduction signal (original signal+high-precision component). Namely, at a part where the user easily perceives insufficient quantization precision, an n+m-bit-length quantization-precision-reproduction signal generated by the high-precision-component-addition unit 37 is transmitted.

Further, when the variable x is an intermediate value (where an expression 0<x<10 holds), the high-frequency-component-adjustment-and-output unit 45 transmits a mixed signal obtained by mixing the original signal with the quantization-precision-reproduction signal. By performing the above-described synthesis processing, the processing corresponding to a predetermined picture pattern can be achieved.

Further, processing that is usually referred to as alpha blend is performed, as the above-described synthesis processing.

By performing the above-described processing procedures, the quantization precision can be reproduced while maintaining the characteristics of the original signal as much as possible.

(B-4) Fourth Embodiment

A fourth embodiment of the present invention is provided, as an example modification of the third embodiment. In the fourth embodiment, the combination ratio of the original signal (the n-bit digital signal) and the quantization-precision-reproduction signal (=original signal+high-precision component) is also increased and/or decreased in the complementary manner by using the detected high-frequency-component signal, as is the case with the third embodiment.

The fourth embodiment describes a quantization-precision-reproduction circuit configured to change the detection characteristic of the high-frequency-detection unit 43, as required, according to a picture pattern obtained by the original signal.

Figure 9:
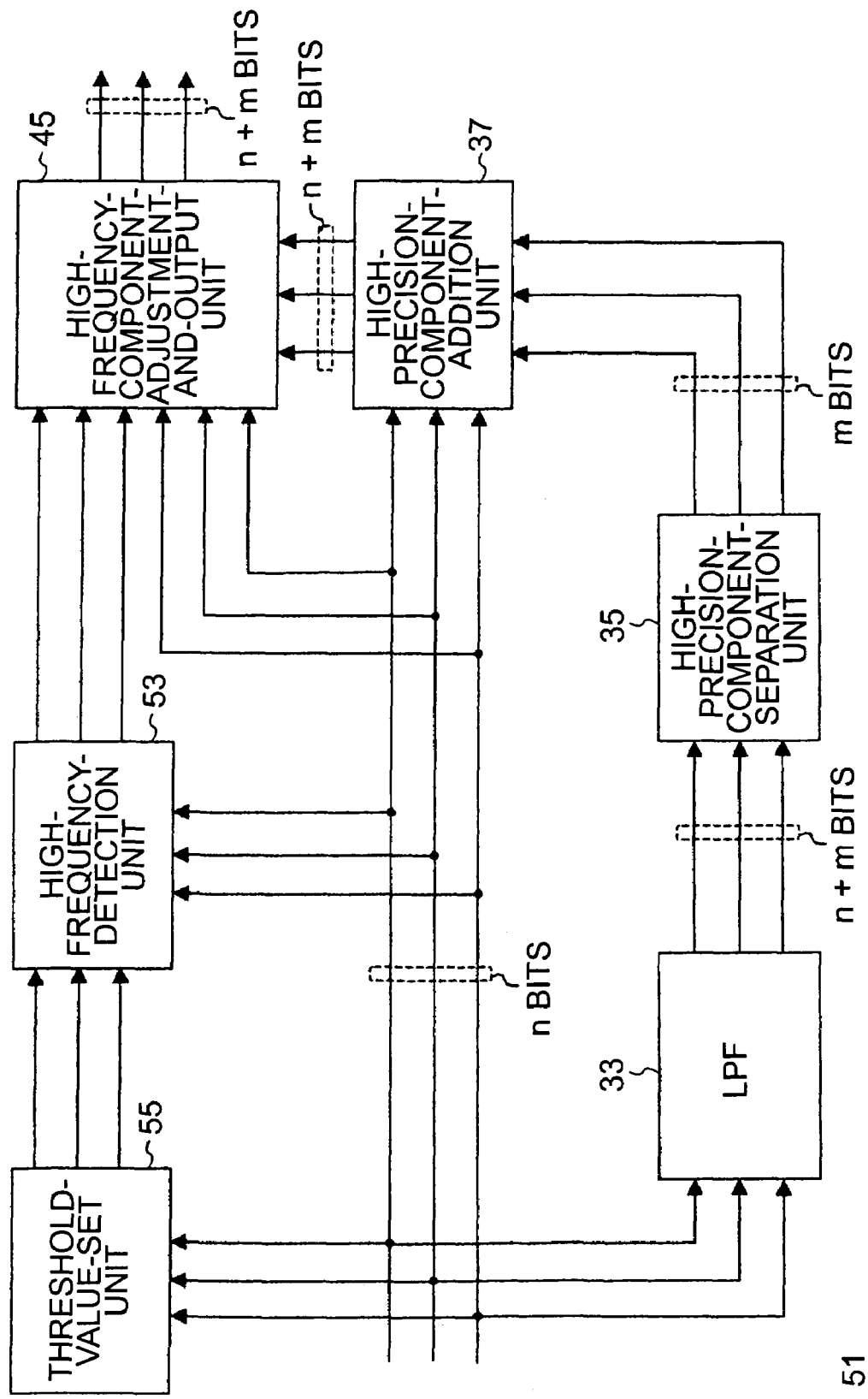
FIG. 9 shows a quantization-precision-reproduction circuit according to another embodiment of the present invention.

FIG. 9 shows a quantization-precision-reproduction circuit 51 according to the fourth embodiment. In FIG. 9, the same parts as those shown in FIG. 8 are designated by the same reference numerals, so as to omit the description thereof.

The quantization-precision-reproduction circuit 51 includes the low-pass filter 33, the high-precision-component-separation unit 35, the high-precision-component-addition unit 37, the high-frequency-component-adjustment-and-output unit 45, a high-frequency-detection unit 53, and a threshold-value-set unit 55. That is to say, the quantization-precision-reproduction circuit 51 is different from the above-described quantization-precision-reproduction circuits in that it includes the high-frequency-detection unit 53 and the threshold-value-set unit 55.

The high-frequency-detection unit 53 is different from the high-frequency-detection unit 43 of the third embodiment in that the high-frequency-detection unit 53 compares the detection-output value of a high-frequency component and the threshold value thereof, and determines the level of the amount of high-frequency components included in the original signal.

Here, the high-frequency-detection unit 53 has at least one threshold value.

For example, if the high-frequency-detection unit 53 has a single threshold value, a determination-output signal functions, as a signal used for selecting either the original signal or the quantization-precision-reproduction signal (=original signal+high-precision component). Namely, if a detected high-frequency-component-output value is higher than the threshold value, which means that the high-frequency-component number is high, the determination-output signal functions, as a signal used for selecting the original signal. On the other hand, if the detected high-frequency-component-output value is lower than or equal to the threshold value, which means that the high-frequency-component number is low, the determination-output signal functions, as a signal used for selecting the quantization-precision-reproduction signal.

Of course, if the threshold-value number is increased, the number of patterns of mixing the original signal with the quantization-precision-reproduction signal increases by as much as the increased threshold-value number.

In the fourth embodiment, the threshold value is prepared for each of the color signals. The threshold-value set unit 55 is configured to set the threshold value for each of the color signal.

It is preferable that the threshold-value set unit 55 has several types of threshold values that are set on the basis of experience according to the visual characteristic of a person and has a function of switching between the threshold values, as required, according to a predetermined picture pattern obtained by an original signal for processing.

Further, the threshold-value-set unit 55 may have a function of switching between the threshold values, as required, according to the intensity of the saturation of each color.

Further, the threshold-value-set unit 55 may have a function of switching between the threshold values, as required, according to the color-phase information of the original signal.

Thus, if the threshold-value-set unit 55 has at least two threshold values so that the threshold-value-set unit 55 can switch between the threshold values according to the characteristic of an original signal, the quality of an image generated by digital signals with reproduced quantization precision can be increased.

(B-5) Fifth Embodiment

A fifth embodiment of the present invention shows another quantization-precision-reproduction circuit using the perception characteristic of a person. In the fifth embodiment, a method for adjusting the gain of a high-precision component is described.

Figure 10:
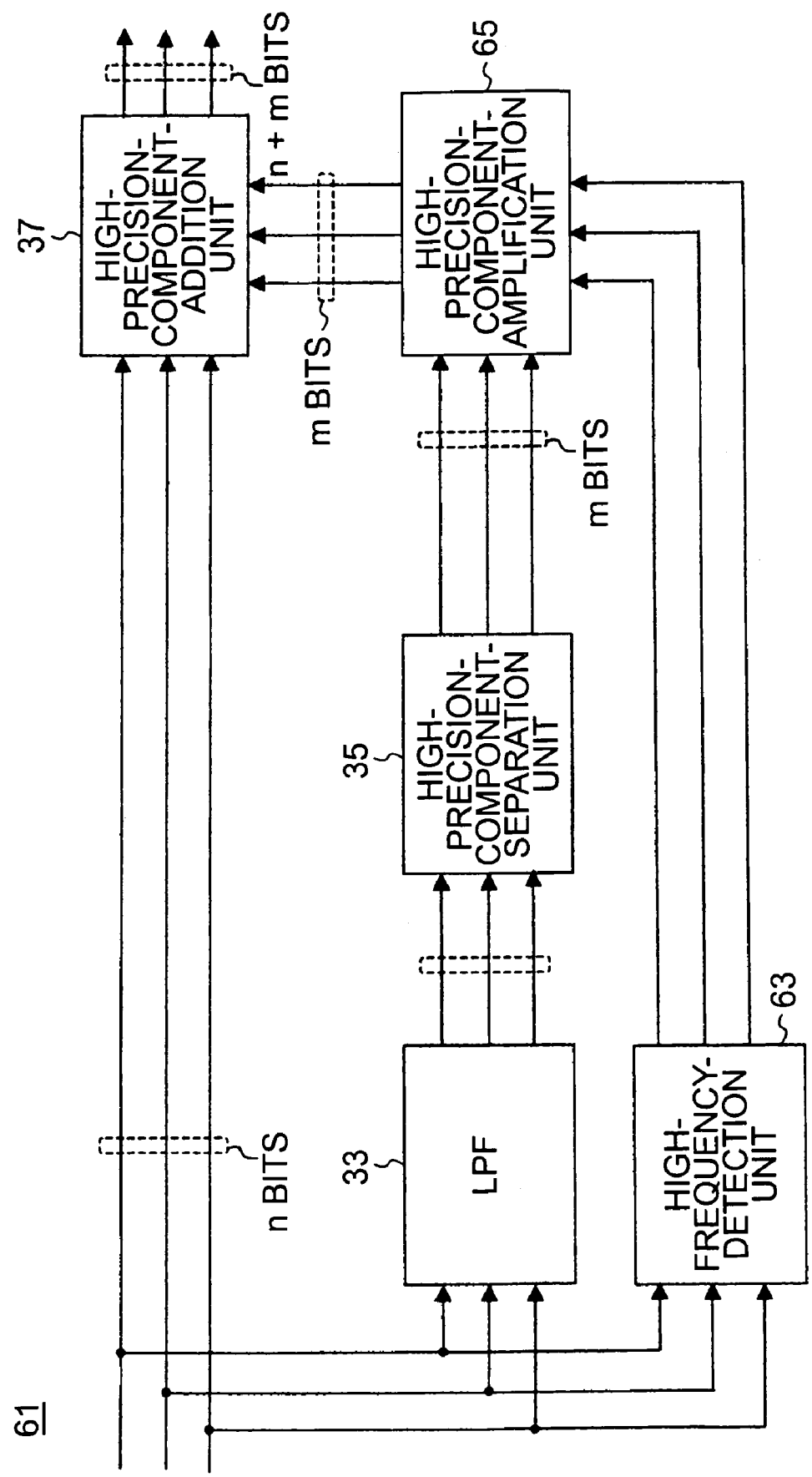
FIG. 10 shows a quantization-precision-reproduction circuit according to another embodiment of the present invention.

FIG. 10 shows a quantization-precision-reproduction circuit 61 according to the fifth embodiment. In FIG. 10, the same components as those shown in FIG. 5 are designated by the same reference numerals, so as to omit the description thereof.

The above-described quantization-precision-reproduction circuit 61 includes the low-pass filter 33, the high-precision-component-separation unit 35, the high-precision-component-addition unit 37, a high-frequency-detection unit 63, and a high-precision-component-amplification unit 65. Namely, the quantization-precision-reproduction circuit 61 is different from the above-described quantization-precision-reproduction circuits in that it includes the high-frequency-detection unit 63 and the high-precision-component-amplification unit 65.

The above-described high-frequency-detection unit 63 is a processing device configured to detect at least one high-frequency component included in the n-bit-length digital signal, that is, the original signal, and set the gain corresponding to the detection result. The above-described gain is used for increasing and/or decreasing an m-bit-length high-precision component. For example, the gain is set so that the gain value decreases as the high-frequency-component value increases, and increases and approaches one as high-frequency-component value decreases.

The high-precision-component-amplification unit 65 adjusts the gain of the m-bit-length high-precision component according to the gain given thereto.

According to the above-described configuration, it becomes possible to increase and/or decrease the amount of at least one high-precision component added to the n-bit-length original signal according to the result of high-frequency-component detection.

(B-6) Sixth Embodiment

According to the above-described embodiments, an increase and/or a decrease in a direct-current (DC) component caused by an added high-precision component can be ignored. However, as the bit number of the high-precision component increases, a DC-component drift increases.

FIG. 11 shows a quantization-precision-reproduction circuit 71 according to the sixth embodiment having a function of cancelling the DC-component drift that occurs due to the added high-precision component. In FIG. 11, the same parts as those shown in FIG. 2 are designated by the same reference numerals, so as to omit the description thereof.

The above-described quantization-precision-reproduction circuit 71 includes the high-precision-component-generation unit 23, the high-precision-component-addition unit 25, and a DC-shift unit 73. Namely, the quantization-precision-reproduction circuit 71 is different from the above-described quantization-precision-reproduction circuits in that it includes the DC-shift unit 73.

The DC-shift unit 73 is a processing device configured to calculate the impact of a high-precision component on the DC level of an original signal and subtracts the impact value from the high-precision component. Namely, the DC-shift unit 73 makes the DC level of the original signal agree with that of the quantization-precision-reproduction signal.

In the fourth embodiment, the DC-shift unit 73 shifts the high-precision-component level. However, it is also possible to use a method for shifting the high-precision-component level after the quantization-precision-reproduction signal is generated.

(C) Other Systems

Thus, in the above-described embodiments, the image-pickup system has been described. Hereinafter, other systems that can include at least one of the above-described quantization-precision-reproduction circuits will be described.

(C-1) Seventh Embodiment

FIG. 12 shows the configuration of a communication system 81 according to a seventh embodiment of the present invention, where the communication system 81 includes at least one of the above-described quantization-precision-reproduction circuits. The communication system 81 includes a transmission device 83 and a reception device 85. The transmission device 83 is configured to transmit digital signals including image data, speech data, measurement data, and so forth according to a predetermined transmission format. The digital signals may be transmitted by a broadcast system or a communication system. Namely, it is only essential that information for transmission is transmitted, as digital signals.

The reception device 85 configured to receive information includes a quantization-precision-reproduction circuit 87, as the above-described quantization-precision-reproduction circuit. Information may be transmitted to the reception device 85 via a recording medium 89. Here, various types of recording mediums may be used, as the recording medium 89.

Since the quantization-precision-reproduction circuit 87 is provided in the communication system, it becomes possible to reproduce a high-precision component lower than or equal to predetermined quantization precision by the reception device 85. Namely, if the bit length of a digital signal is limited by a transmission format and/or a signal format, the communication system allows reproducing information with high quantization precision on the reception-device side.

By using the above-descried advantages, it becomes possible to actively decrease the bit length of a digital signal for transmission on the transmission-device side. Namely, it becomes possible to compress data actively.

By transmitting digital signals with decreased bit lengths, or recording the digital signals with decreased bit lengths onto the recording medium, it becomes possible to transmit and/or record the digital signals by using a decreased transmission band and/or a decreased record area. Namely, it becomes possible to use transmission resources and/or record areas effectively.

(C-2) Eighth Embodiment

Figure 13A:
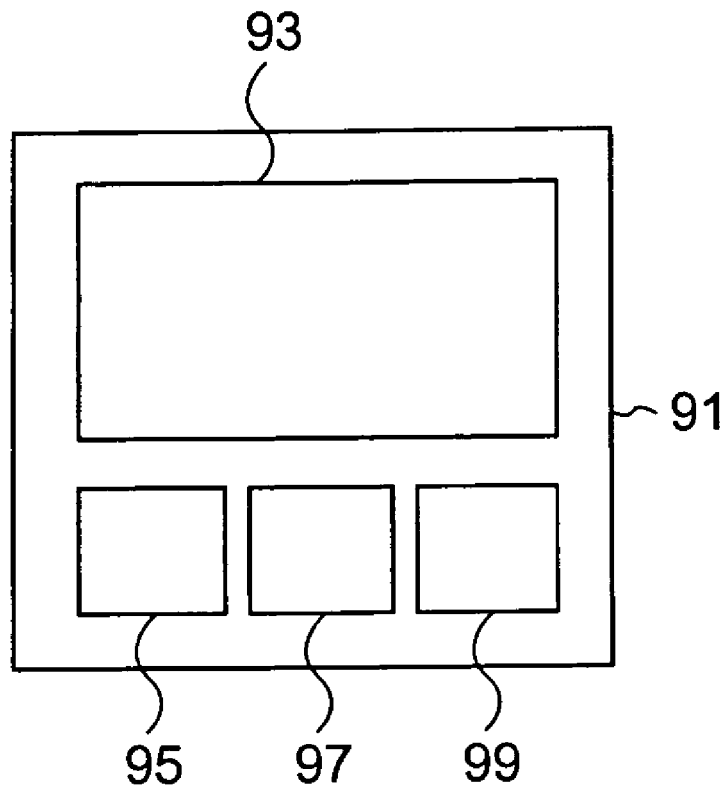
FIG. 13A shows the configuration of an example information-processing device.
Figure 13B:
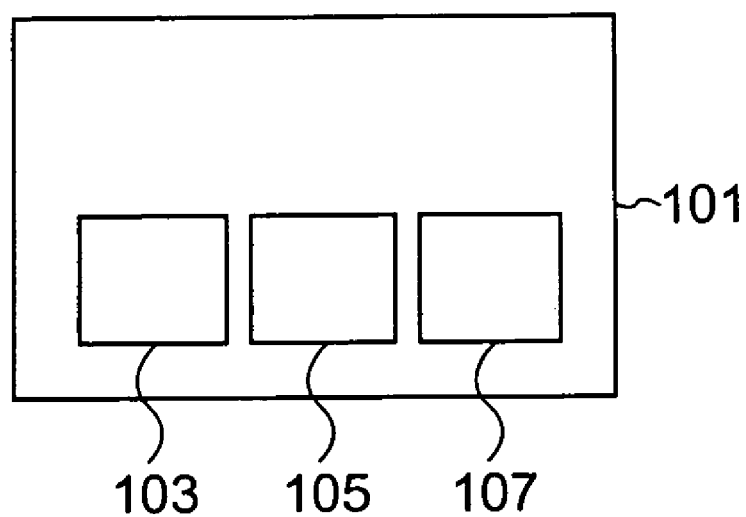
FIG. 13B shows the configuration of another example information-processing device.

FIG. 13A shows an information-processing device 91 according to an eighth embodiment of the present invention. The information-processing device 91 includes at least one of the above-described quantization-precision-reproduction circuits. FIG. 13B shows an information-processing device 101 according to the eighth embodiment of the present invention. The information-processing device 91 includes at least one of the above-described quantization-precision-reproduction circuits. Each of the information-processing device 91 and the information-processing device 101 may be an electronic device including a computer, a printer, a game machine, a mobile information terminal (a mobile computer, a mobile phone, a mobile game machine, an electronic book, and so forth), an image-reproduction device (an optical-disk device, a home server, and so forth) a monitor, a TV receiver, an audio-signal-reproduction device, and so forth.

Each of the information-processing devices 91 and 101 includes a cabinet, a signal-processing unit, and an external interface. Further, each of the information-processing devices 91 and 101 includes the peripheral devices corresponding to the product form thereof, where the peripheral devices are used in combination with the cabinet, the signal-processing unit, and the external interface.

The difference between the information-processing device 91 shown in FIG. 13A and the information-processing device 101 shown in FIG. 13B is whether or not a display unit is included in the cabinet.

The information-processing device 91 shown in FIG. 13A includes a display unit 93 provided in the cabinet thereof. A quantization-precision-reproduction circuit 95, a signal-processing unit 97, and an external interface 99 are also provided in the cabinet of the information-processing device 91.

The information-processing device 101 shown in FIG. 13B does not include a display unit in the cabinet thereof, even though a quantization-precision-reproduction circuit 103, a signal-processing unit 105, and an external interface 107 are provided in the above-described cabinet.

(D) Other Embodiments (a) According to the above-described embodiments, the threshold value of the high-frequency-detection unit is set and/or switched according to the characteristic of an original signal.

Further, the threshold value of the high-frequency-detection unit may be set or switched to a suitable value according to fluctuations in the gain value of the gain-adjustment circuit.

(b) According to the above-described embodiments, the low-pass filter is provided in the quantization-precision-reproduction circuit so that a high-precision component lower than or equal to predetermined quantization precision is generated.

However, the quantization-precision-reproduction circuit may include a high-pass filter and/or a non-linear filter including an epsilon filter, a median filter, and so forth. Irrespective of which filter is used, a high-precision component can be generated on the basis of information of the original signal. Subsequently, the correlation between the high-precision component and the original signal becomes significant with reference to that between a random noise and the original signal.

(c) The above-described embodiments can be modified in various ways in a scope defined by the spirit of the present invention. Further, it should be understood by those skilled in the art that various modifications, combinations, sub-combinations and alterations may occur depending on design requirements and other factors insofar as they are within the scope of the appended claims or the equivalents thereof.

What is claimed is:

1. A method of performing quantization-precision-reproduction of analog data expressed in a digital format comprising:
   reproducing at least one m-bit-length high-precision component lower than or equal to quantization precision of at least one n-bit-length digital signal on the basis of the n-bit-length digital signal; and
   generating at least one n+m-bit-length digital signal by adding the reproduced m-bit-length high-precision component to at least one low-order bit of the n-bit-length digital signal.

2. The quantization-precision-reproduction method according to claim 1, wherein the m-bit-length high-precision component is generated by picking up at least one signal component lower than or equal to the quantization precision of the digital signal from at least one signal component obtained by filtering the n-bit-length digital signal.

3. The quantization-precision-reproduction method according to claim 1, further comprising:
   detecting at least one high-frequency component included in the n-bit-length digital signal;
   controlling a combination ratio of the n+m-bit-length digital signal and the n-bit-length digital signal on the basis of the detection result; and
   generating the n+m-bit-length digital signal according to the combination ratio.

4. The quantization-precision-reproduction method according to claim 1, further comprising:
   detecting at least one high-frequency component included in the n-bit-length digital signal;

generating at least one gain function on the basis of a result of the detection;

generating at least one correction component by amplifying the in-bit-length high-precision component on the basis of the gain function; and using the generated correction component, as the high-precision component added to the low-order bit of the n-bit-length digital signal.

5. The quantization-precision-reproduction method according to claim 3, wherein where the at least one high-frequency component is detected, at least one determination threshold value is changed according to a predetermined picture pattern obtained by at least one digital signal for processing.

6. The quantization-precision-reproduction method according to claim 3, wherein where the at least one high-frequency component is detected, at least one determination threshold value is changed according to at least one gain added to at least one digital signal for processing.

7. The quantization-precision-reproduction method according to claim 3, wherein where the at least one high-frequency component is detected, at least one determination threshold value is changed according to saturation of at least one digital signal for processing.

8. The quantization-precision-reproduction method according to claim 3, wherein where the at least one high-frequency component is detected, at least one determination threshold value is changed according to a color phase of at least one digital signal for processing.

9. The quantization-precision-reproduction method according to claim 1, further comprising correcting fluctuations in a direct-current level caused by the addition of the reproduced in-bit-length high-precision component.

10. A quantization-precision-reproduction device comprising:

at least one high-precision-component-generation unit configured to reproduce at least one m-bit-length high-precision component lower than or equal to quantization precision of at least one n-bit-length digital signal on the basis of the n-bit-length digital signal; and at least one precision-information-addition unit configured to generate at least one n+m-bit-length digital signal by adding the reproduced in-bit-length high-precision component to at least one low-order bit of the n-bit-length digital signal.

11. An image-pickup device comprising:

an analog-to-digital conversion unit configured to convert at least one imaging signal generated in analog-signal format into at least one n-bit-length signal generated in digital-signal format;

at least one high-precision-component-generation unit configured to reproduce at least one m-bit-length high-precision component lower than or equal to quantization precision of the n-bit-length digital signal on the basis of the n-bit-length digital signal; and at least one precision-information-addition unit configured to generate at least one n+m-bit-length digital signal by adding the reproduced m-bit-length high-precision component to at least one low-order bit of the n-bit-length digital signal.

12. An information-processing device comprising:

at least one high-precision-component-generation unit configured to reproduce at least one m-bit-length high-precision component lower than or equal to quantization precision of at least one n-bit-length digital signal on the basis of the n-bit-length digital signal; and at least one precision-information-addition unit configured to generate at least one n+m-bit-length digital signal by adding the reproduced m-bit-length high-precision component to at least one low-order bit of the n-bit-length digital signal.

13. A computer readable medium including computer executable instructions which causes a computer to implement a method of quantization-precision-reproduction of analog data expressed in a digital format comprising:

reproducing at least one m-bit-length high-precision component lower than or equal to quantization precision of at least one n-bit-length digital signal on the basis of the n-bit-length digital signal; and generating at least one n+m-bit-length digital signal by adding the reproduced m-bit-length high-precision component to at least one low-order bit of the n-bit-length digital signal.

* * * * *

UNITED STATES PATENT AND TRADEMARK OFFICE
CERTIFICATE OF CORRECTION

PATENT NO. : 7,265,687 B2
APPLICATION NO. : 11/344138
DATED : September 4, 2007
INVENTOR(S) : Yoshiaki Nishide et al.

It is certified that error appears in the above-identified patent and that said Letters Patent is hereby corrected as shown below:

Column 13, line 4, change "in-bit-length" to --m-bit-length--;
line 33, change "in-bit-length" to --m-bit-length--;
line 43, change "in-bit-length" to --m-bit-length--.

Signed and Sealed this

Twenty-ninth Day of April, 2008

JON W. DUDAS
*Director of the United States Patent and Trademark Office*